(12) United States Patent
Yong et al.

(10) Patent No.: US 6,214,691 B1
(45) Date of Patent: Apr. 10, 2001

(54) METHOD FOR FORMING SHALLOW TRENCH ISOLATION

(75) Inventors: Gwo-Shii Yong; Chih-Chien Liu; Tri-Rung Yew; Water Lur, all of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/228,932

(22) Filed: Jan. 12, 1999

(51) Int. Cl.⁷ .................................................. H01L 21/76
(52) U.S. Cl. ............................ 438/400; 438/221; 438/424
(58) Field of Search ..................................... 438/400, 425, 438/427, 435, 359, 444, 221, 407, 424

(56) References Cited

U.S. PATENT DOCUMENTS 5,970,363 * 10/1999 Kepler et al. .......................... 438/435
6,040,233 * 3/2000 Hodges .................................. 438/427
6,054,364 * 4/2000 Gardner et al. ....................... 438/425
6,124,183 * 9/2000 Karlsson et al. ...................... 438/427

* cited by examiner

Primary Examiner—David Nelms
Assistant Examiner—Phuc T. Dang
(74) Attorney, Agent, or Firm—Bacon & Thomas, PLLC

(57) ABSTRACT

A method for forming shallow trench isolation is disclosed. The method includes forming a trench in a semiconductor substrate, and then blanket depositing a silicon oxide layer over the semiconductor substrate by a plasma process, thereby substantially refilling the trench. Thereafter, a photoresist layer is formed on the plasma deposited silicon oxide layer, followed by etching back a portion of the photoresist layer. The plasma deposited silicon oxide layer is then isotropically etched, and the photoresist layer is then finally removed.

11 Claims, 4 Drawing Sheets

METHOD FOR FORMING SHALLOW TRENCH ISOLATION

BACKGROUND OF THE INVENTION

1. Field of the Invention

The present invention relates to a method for forming trench isolation, and particularly, to a method for forming shallow trench isolation without microscratches by using High-Density-Plasma (HDP) process.

2. Description of the Prior Art

Chemical-Mechanical polishing (CMP) is conventionally used in semiconductor manufacturing to achieve global planarity. The chemical-mechanical polishing generally includes a rotating table for holding a wafer, where slurry and a polishing pad are applied. Chemical-Mechanical polishing is usually used to planarize trenches, such as shallow trench isolation. During trench refilling step in forming a shallow trench isolation, as shown in Figure 1A, silicon dioxide 110 is deposited over a semiconductor substrate 112, thereby refilling the trench 114. Figure 1B shows the cross section of the formed shallow trench isolation 110A, which is formed by planarizing the vapour deposited silicon dioxide 110 by a conventional Chemical-Mechanical polishing until the top surface of the silicon nitride layer 116 atop of the substrate 112 is exposed.

Unfortunately, due to the inherent drawbacks of the chemical-mechanical polishing mechanism, the surface of the shallow trench isolation 110A can not be made substantially planar, and thus possesses microscratch problem which seriously yields degradation in the manufactured device.

For the foregoing reasons, there is a need for a method of forming shallow trench isolation without aforementioned microscratches problem.

SUMMARY OF THE INVENTION

In accordance with the present invention, a method is provided for forming shallow trench isolation that substantially eliminating microscratch problem.

In one embodiment, a pad oxide and SiN layers are firstly formed on a silicon substrate. The trenches are then defined by Lithography/Etch processes. After that, a thin liner is thermally grown followed by high-density-plasma (HDP) refilled oxide. Thereafter, a High-Density-Plasma (HDP) silicon oxide layer is blanket deposited over the silicon nitride layer and the trench, thereby refilling the trench, wherein top surface of the High-Density-Plasma silicon oxide layer in the trench is approximately lower than top surface of the silicon nitride layer. A photoresist layer is formed on the High-Density-Plasma silicon oxide layer, followed by etching back a portion of the photoresist layer. The High-Density-Plasma silicon oxide layer on the top of active area is isotropically etched, wherein portion of the refilled High-Density-Plasma silicon oxide layer in the trench is protected from being etched by the atop photoresist layer. Finally, the photoresist layer is removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The invention is a method for forming shallow trench isolation, which consists the following steps: firstly forming a trench in a semiconductor substrate, there is a silicon oxide layer on the top of semiconductor as well as a silicon nitride layer on the semiconductor substrate. Then a High-Density-Plasma (HDP) silicon oxide layer is blanket deposited over the silicon nitride layer and the trench. Thereby refilling the trench, wherein top surface of the High-Density-Plasma silicon oxide layer in the trench is approximately lower than top surface of the silicon nitride layer. Sequentially forming a photoresist layer on the High-Density-Plasma silicon oxide layer. A portion of the photoresist layer is etched back and isotropically etched portion of the High-Density-Plasma silicon oxide layer. Wherein portion of the refilled High-Density-Plasma silicon oxide layer in the trench is normally protected by the atop photoresist layer from being etched. Finally the photoresist layer is removed for the last step of whole processing.

Figure 1A:
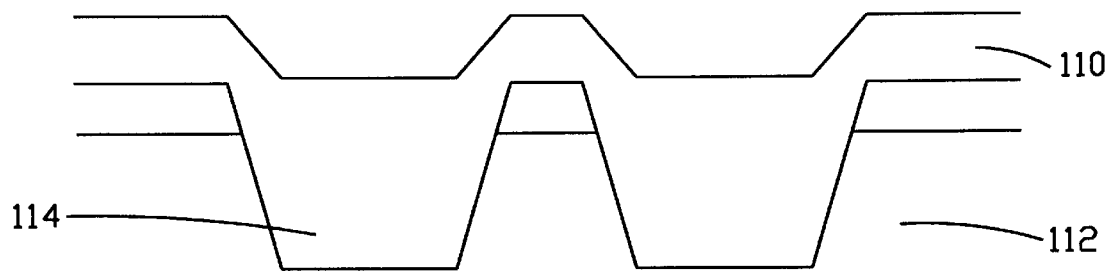
FIG. 1A and FIG. 1B show cross-sections of conventionally form, shallow trench isolation using Chemical-Mechanical polishing.
Figure 1B:
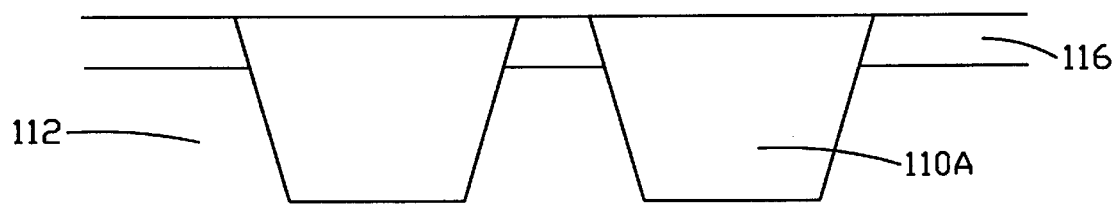
Figure 2A:
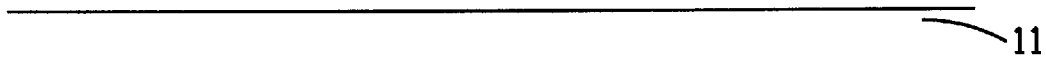
FIGS. 2A to 2I show cross-sectional views illustrative of various stages in the fabrication of shallow trench isolation in accordance with one embodiment of the present invention.
Figure 2B:
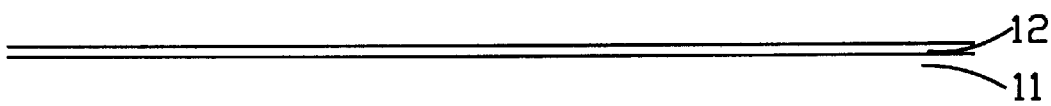
Figure 2C:
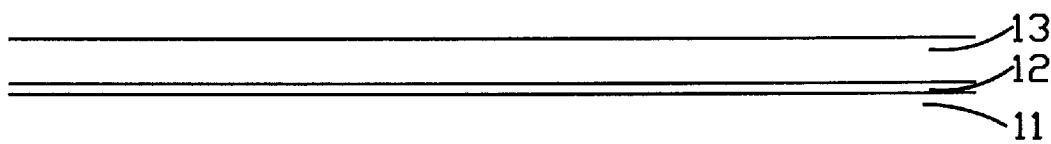
Figure 2D:
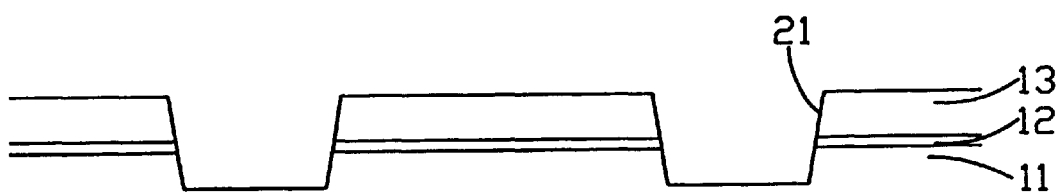

As FIG. 2A shown, process is started with a blanket Silicon wafer 11. Firstly a pad oxide 12, about 50 to 200 angstroms, is thermally grown on the top of silicon, as FIG. 2B. Then as FIG. 2C, a SiN layer 13, about 500 to 2500 angstroms, there is vapour deposited. Sequentially FIG. 2D, trenches 21 are defined using conventional Lithography/Etch process. Also, the width of trenches 21 is about 0.1 $\mu$m or hundreds of $\mu$m, not critical limited. However, depth may be specified as 2000 to 5000 angstroms.

Figure 2E:
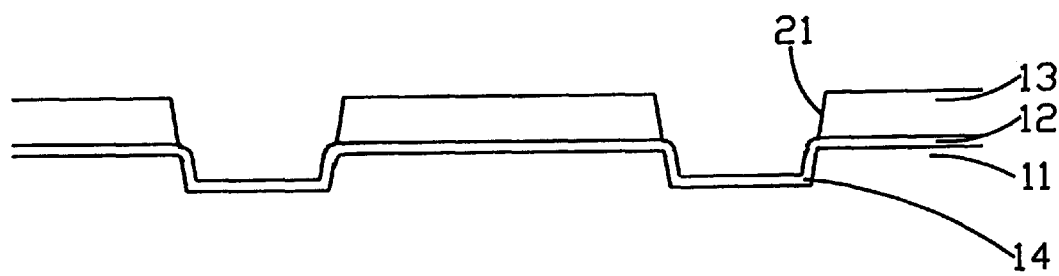
Figure 2F:
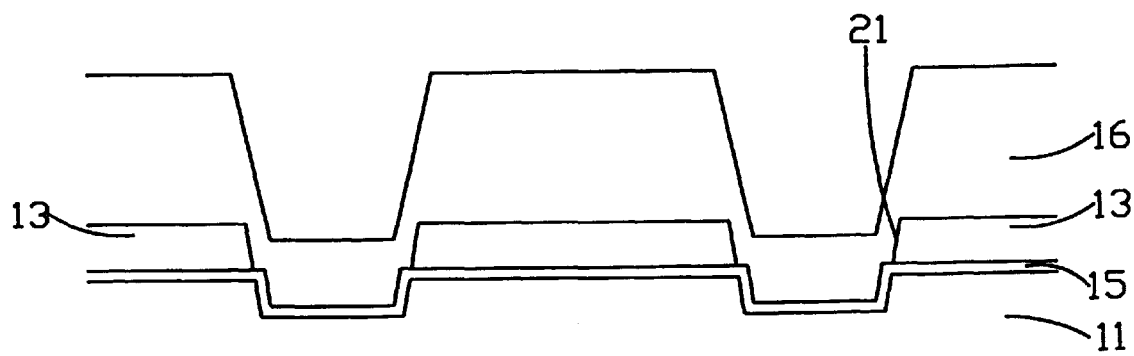
Figure 2G:
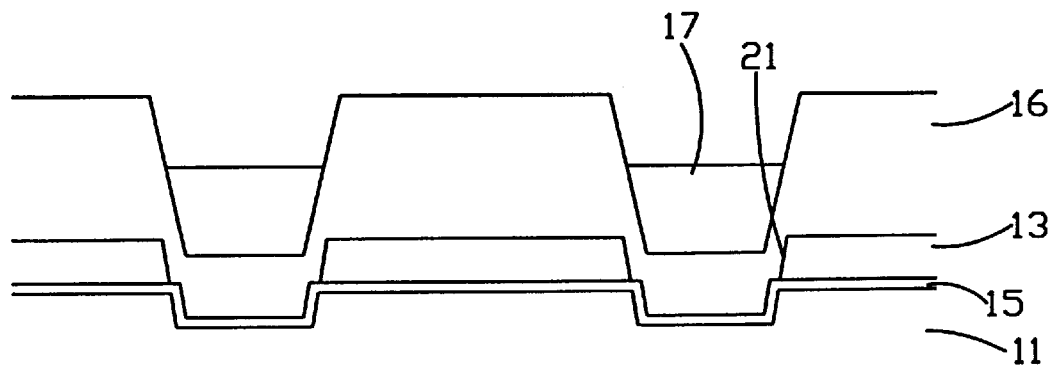

FIG. 2E shows Liner oxide 14, about 100 to 500 angstroms, there is formed usually by thermal oxidation. At this moment, Liner Oxide 14 is composited with Pad Oxide 12 as an oxide layer 15, FIG. 2F. The same FIG. 2F, High-Density-Plasma deposited oxide 16, about 5000 to 10000 angstroms, is formed onto the above surface of layer. The thickness depends on the depth of trench thick of SiN. Then FIG. 2G is shown to refill trenches to an optional level.

In this embodiment, a High-Density-Plasma (HDP) chemical vapour deposition is used. The ratio of ionized to non-ionized species in the High-Density-Plasma deposition step is about 5000 to 10000 angstroms. It is particularly noted that the slope of the sidewall of the HDP-deposited silicon oxide layer 16 from FIG. 2G approximately touches the corner of the underlying silicon nitride layer 13. The surface in the valley of the HDP-deposited silicon oxide layer 16 is substantially lower than the surface of the silicon nitride layer 13, but generally higher than that of the linear silicon oxide layer 14. Subsequently, a photoresist layer of about 800 to 3000 angstroms in thickness is further deposited over the HDP-deposited silicon oxide layer 16 as shown in FIG. 2G.

Figure 2H:
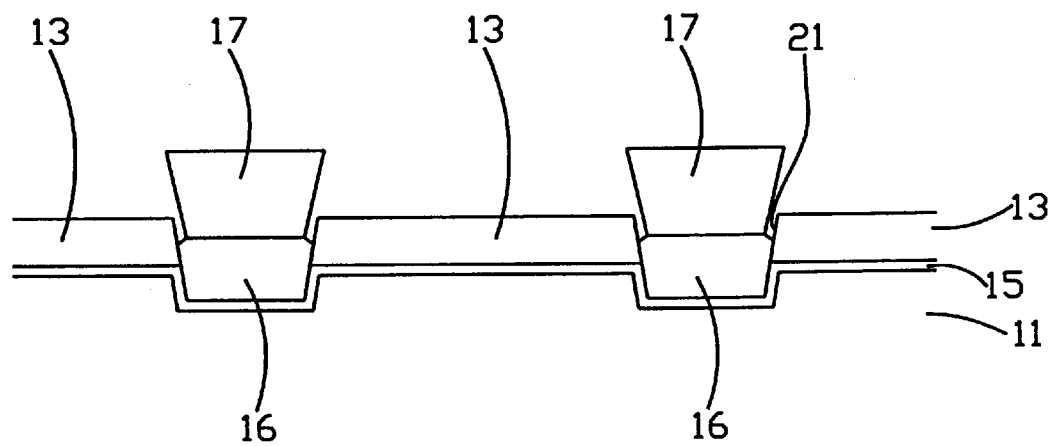

An etch back process is then performed on the photoresist layer 17 so that portion, of about 800 to 3000 angstroms in thickness, of the photoresist 17 is remained in the valleys of the HDP-deposited silicon oxide layer 16 as shown in FIG. 2H. Photoresist 17, as FIG. 2H is spun on and then particularly etched to an optional level where refilled oxide on the top of active area is exposed to a proper degree. Refilled oxide on the active area then is wet etched leave behind oxide in trench that is protected by photoresist.

FIG. 2H also shows the resulting cross-section after portion of the HDP-deposited silicon oxide layer 16 is isotropically removed. In this embodiment, a conventional wet etch is used. It is appreciated that other isotropic etch method, such as isotropic dry etch, can be alternatively used. Also, it is particularly noted that, due to protection of the atop photoresist 17, the HDP-deposited silicon oxide layer 16 in the trench 21 is thus prevented from being etched.

Figure 2I:
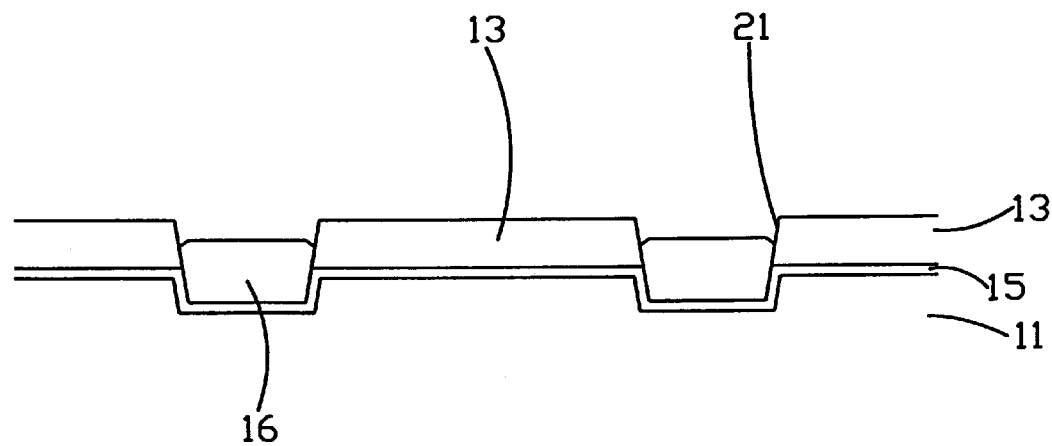

Finally, the photoresist 17 is removed by using a conventional photoresist removing technique, therefore resulting in the shallow trench isolation structure as shown in FIG. 2I. In the resulting shallow trench isolation, the surface of the HDP-deposited silicon oxide layer 16 has a planar surface, and possesses no microscratch problem owing to eliminating chemical-mechanical polishing process.

Although specific embodiments have been illustrated and described, it will be obvious to those skilled in the art that various modifications may be made without departing from what is intended to be limited solely by the appended claims.

What is claimed is:

1. A method for forming trench isolation, said method comprising:
   forming a trench in a semiconductor substrate having an oxide layer thereon and a silicon nitride layer on said oxide layer;
   blanket depositing a silicon oxide layer over said semiconductor substrate by a plasma process, thereby substantially refilling the trench;
   forming a photoresist layer on said plasma deposited silicon oxide layer;
   etching back a portion of said photoresist layer;
   isotropically etching portion of said plasma deposited silicon oxide layer, wherein portion of said refilled plasma deposited silicon oxide layer in the trench is protected by the atop photoresist layer from being etched; and
   removing said photoresist layer.

2. The method according to claim 1, wherein said plasma process comprises high-density-plasma deposition process.

3. The method according to claim 2, wherein ratio of ionized to non-ionized species in said high-density-plasma deposition process is about 5000 to 10000 angstroms.

4. The method according to claim 1, wherein said isotropically etching said plasma deposited silicon oxide layer comprises etching said plasma deposited silicon oxide layer using a wet etch process.

5. The method according to claim 1, wherein said isotropically etching said plasma deposited silicon oxide layer comprises etching said plasma deposited silicon oxide layer using an isotropic dry etch process.

6. The method according to claim 1, further comprising blanket forming a silicon oxide layer on said semiconductor substrate before blanket depositing said plasma deposited silicon oxide layer.

7. A method for forming shallow trench isolation, said method comprising:
   forming a trench in a semiconductor substrate and a silicon oxide layer on said semiconductor substrate and a silicon nitride layer on said silicon oxide layer;
   blanket depositing a high-density-plasma (HDP) silicon oxide layer over said silicon nitride layer and the trench, thereby refilling the trench, wherein top surface of said high-density-plasma silicon oxide layer in the trench is approximately lower than top surface of said silicon nitride layer;
   forming a photoresist layer on said high-density-plasma silicon oxide layer;
   etching back a portion of said photoresist layer;
   isotropically etching portion of said high-density-plasma silicon oxide layer, wherein portion of said refilled high-density-plasma silicon oxide layer in the trench is protected by the atop photoresist layer from being etched; and
   removing said photoresist layer.

8. The method according to claim 7, wherein ratio of ionized to non-ionized species in said high-density-plasma deposition step is about 5000 to 10000 angstroms.

9. The method according to claim 7, wherein said isotropically etching said high-density-plasma silicon oxide layer comprises etching said high-density-plasma silicon oxide layer using a wet etch process.

10. The method according to claim 7, wherein said isotropically etching said high-density-plasma silicon oxide layer comprises etching said high-density-plasma silicon oxide layer using an isotropic dry etch process.

11. The method according to claim 7, wherein said shallow trench has width of about 0.1 $\mu$m, and has depth of about 2000 to 5000 angstroms.

* * * * *